US007998659B2

(12) United States Patent
Takagi et al.

(10) Patent No.: US 7,998,659 B2
(45) Date of Patent: *Aug. 16, 2011

(54) PHOTOSENSITIVE LAMINATED ORIGINAL PRINTING PLATE FOR LETTERPRESS PRINTING AND PROCESS FOR PRODUCING LETTERPRESS PRINTING PLATE USING THE PHOTOSENSITIVE LAMINATED ORIGINAL PRINTING PLATE

(75) Inventors: Toshiya Takagi, Kawasaki (JP); Takashi Fujimoto, Kawasaki (JP)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/908,061

(22) PCT Filed: Nov. 29, 2005

(86) PCT No.: PCT/JP2005/021906
§ 371 (c)(1),
(2), (4) Date: Nov. 29, 2007

(87) PCT Pub. No.: WO2006/095472
PCT Pub. Date: Sep. 14, 2006

(65) Prior Publication Data
US 2009/0023094 A1     Jan. 22, 2009

(30) Foreign Application Priority Data
Mar. 11, 2005  (JP) ................. 2005-069307

(51) Int. Cl.
*G03F 7/00* (2006.01)
*G03F 7/26* (2006.01)

(52) U.S. Cl. ............ 430/302; 430/270.1; 430/309; 430/306; 101/453; 101/463.1

(58) Field of Classification Search ........... 430/302
See application file for complete search history.

(56) References Cited

U.S. PATENT DOCUMENTS

| 4,555,471 | A  |    | 11/1985 | Barzynski et al. |
|-----------|----|----|---------|------------------|
| 5,719,009 | A  | *  | 2/1998  | Fan ............... 430/306 |
| 6,020,108 | A  |    | 2/2000  | Goffing et al. |
| 6,245,481 | B1 |    | 6/2001  | Teng |
| 6,558,876 | B1 |    | 5/2003  | Fan |
| 6,566,029 | B2 |    | 5/2003  | Kawamura et al. |
| 6,893,796 | B2 | *  | 5/2005  | Ray ............... 430/273.1 |
| 6,897,006 | B2 | *  | 5/2005  | Fujimoto et al. ...... 430/273.1 |
| 2002/0115019 | A1 |  | 8/2002  | Kaczun et al. |
| 2006/0008729 | A1 | * | 1/2006 | Ichikawa et al. ...... 430/270.1 |
| 2006/0177771 | A1 | * | 8/2006 | Takagi et al. ......... 430/300 |

FOREIGN PATENT DOCUMENTS

| EP | 0720057 A1 | 7/1996 |
| EP | 1 239 329 A2 | 9/2002 |
| JP | 8305030 | 11/1996 |
| JP | 9171247 | 6/1997 |
| JP | 10509254 | 9/1998 |
| JP | 11352670 | 12/1999 |
| JP | 11352670 A * | 12/1999 |
| JP | 2001324815 | 11/2001 |
| JP | 2002214792 | 7/2002 |
| JP | 2002357907 | 12/2002 |
| JP | 2004101751 | 4/2004 |
| WO | 96/16356 A1 | 5/1996 |
| WO | WO 96/16356 | 5/1996 |
| WO | WO 2004038507 A1 * | 5/2004 |

OTHER PUBLICATIONS

Notice of Reasons for Rejection issued to Taiwanese Patent Application No. 094143784, mailed Nov. 26, 2008.
Notice of Reasons for Rejection issued to Chinese Application No. 200580048980.1, mailed Jan. 8, 2010.
Supplementary European Search Report for EP 05 81 1727, dated Jun. 7, 2010.

* cited by examiner

*Primary Examiner* — Cynthia H Kelly
*Assistant Examiner* — Chanceity N Robinson

(57) ABSTRACT

A photosensitive laminated original printing plate for letterpress printing that does not contaminate developers, being capable of suppressing a cost increase due to developer replacement and is of high quality; and a process for producing a letterpress printing plate using the photosensitive laminated original printing plate for letterpress printing. There is provided a photosensitive laminated original printing plate for letterpress printing, comprising a support and, at least sequentially superimposed thereon, a photosensitive resin layer which is sensitive to ultraviolet radiation and is developable with water or a mixture of water and alcohol and a mask material layer which contains at least a nonultraviolet-absorbing organic dye and ultraviolet-absorbing organic dye and a binder soluble or dispersible in water or a mixture of water and alcohol and is removable by means of water or a mixture of water and alcohol, wherein the nonultraviolet-absorbing and ultraviolet-absorbing materials are of compositions having compatibility with the binder.

3 Claims, No Drawings

PHOTOSENSITIVE LAMINATED ORIGINAL PRINTING PLATE FOR LETTERPRESS PRINTING AND PROCESS FOR PRODUCING LETTERPRESS PRINTING PLATE USING THE PHOTOSENSITIVE LAMINATED ORIGINAL PRINTING PLATE

CROSS-REFERENCE TO RELATED APPLICATIONS

This application is the National Stage of International Application No. PCT/JP2005/021906, which designates the U.S., filed Nov. 29, 2005, which claims the benefit of Japanese Application No. 2005-069307, filed Mar. 11, 2005, the contents of which are incorporated by reference herein.

TECHNICAL FIELD

The present invention relates to a photosensitive laminated original printing plate for letterpress printing and a process for producing a letterpress printing plate using the photosensitive laminated original printing plate, particularly, relates to a photosensitive laminated original printing plate for fine letterpress printing, which does not contaminate a developing solution, can reduce the cost for exchanging the developing solution, and is suitable for letterpress printing resolving vexatious complication, and a process for producing a letterpress printing plate using the photosensitive laminated original printing plate.

BACKGROUND ART

The letterpress printing is a kind of relief printing to develop with water or a mixture of water and an alcohol. As well known, letterpress printing is water developed, and is excellent in economic properties, versatility and causing no environmental contamination. For this reasons, the flexographic printing is reevaluated, and recently has attracted attention due to an improvement in printing accuracy.

In Japan, as printing methods, offset printing and gravure printing are relatively widely used, while relief printing such as letterpress printing and flexographic printing has not been comparatively used so often. However, the letterpress printing has the following advantages over the other printing methods:

(1) An anastatic printing plate is used, therefore the printing on a printing object which is not flat or smooth such as a corrugated fiberboard is possible. In addition, the printing can be achieved at relatively high speed and low cost.
(2) Clear printing can be conducted inexpensively on an object having a small area such as a label.
(3) Printing can be made at a high ink density as compared to offset printing, thus enabling clearer printing.
(4) The profile of characters or images is sharp as compared to that obtained by gravure printing.
(5) Water development results in lower cost and lower risk of environmental contamination than solvent development.
(6) The time required for stabilizing the color from the start of the printing is short, and hence the waste of a printing medium such as paper can be reduced, which is advantageous from an economical point of view.
(7) The printing can be achieved in small lots and many kinds.

In this way, the relief printing is a conventional printing technique, and the letterpress printing is also a printing technique conventionally used and has been well known to have the various advantages mentioned above. However, a frequency of the use of the flexographic printing relative to the whole printed matter has not been high.

However, in recent years, as the materials used for printing ink and printing original plate are improved in quality and interests in the environmental issues are increasing, the relief printing including letterpress printing is reevaluated, and studies and developments are being vigorously made with a view to positively using such printing.

Here, a progress in development of the printing original plate itself is as follows. The letterpress printing plate has been formed from a metal or a hard resin for a long period, and produced by engraving the hard layer to form a negative image of characters or images to be printed. However, a photosensitive resin is begun to be used recently. The photosensitive resin generally includes an elastomeric binder, at least one monomer, and a photopolymerization initiator. An original printing plate produced using this photosensitive resin is a plate member provided with a layer of the photosensitive resin on a support.

In production of a letterpress plate using this original printing plate, first a film (mask) having a negative pattern of an image such as a text and a picture to be printed is placed on the photosensitive resin layer of this original printing plate, and the photosensitive resin layer is then exposed to a chemical ray via this mask. The portion irradiated with actinic radiation undergoes a photopolymerization reaction and then is cured. Subsequently, the uncured portion is washed away with a developing solution, so that a relief pattern corresponding to the image remains, thus forming a letterpress printing plate. In the letterpress printing, an ink is put on the top surface of the relief pattern, which is compressed on a printing medium such as paper to carry out printing.

In original printing plate using this photosensitive resin, it has been desired that the following problems that had been pointed out be solved.
(i) When a final pattern of a negative mask is required to be modified, it is necessary to remake the whole photographic negative mask since it is impossible to modify the mask partly, so that it takes comparatively lots of time for modifying the mask.
(ii) A size of the negative mask may easily alter due to changes of temperature and humidity because the negative mask is composed of a negative film. Thus, even if the same negative mask is used, each pattern-forming step including the light exposure and development of the photosensitive resin layer may result in different accuracy of the printing plate products, due to difference in timing and environment for performing the procedure.
(iii) In the pattern forming step, a substance such as dust which inhibits light incidence tends to come in between the negative mask and the photosensitive resin layer. If such a substance has come in, a pattern image obtained after the exposure and the development may be disturbed, which may deteriorate printing quality of the printing plate.

In order to solve such problems, several kinds of original printing plates with new constitution were developed recently (Patent Documents 1 and 2). The constitutional feature that is common over the original printing plate of these days is in that an infrared ray-sensitive material is at least formed on the photosensitive resin layer, in which the infrared ray-sensitive material layer is constituted to be capable of functioning as the conventional photographic negative mask. This infrared ray-sensitive material layer is nontransparent to the actinic rays light curing the photosensitive resin, and sensitive to infrared rays. The term "infrared ray-sensitive" means to be evaporated and/or decomposed by exposure using infrared laser beams, so-called ablation. Thus, the infrared ray-sensitive layer is also referred to as the infrared ablation layer.

By laminating the infrared ablation layer, printed image information can be recorded directly on original printing plate for letterpress printing by using infrared laser beams, whereby a mask film consisting of a conventional negative film can be omitted. The printed image information can be created, saved, modified, and output as a digital information. When the letterpress printing plate is made by the constitution providing the infrared ablation layer, the cost for image information processing required in use of a conventional mask film is sufficiently reduced.

Several compositions of the infrared ablation layer have been suggested; however, they are substantially similar. For example, in the original printing plate as described in Patent Document 1, the infrared ablation layer is constituted with a water-soluble binder, a water-dispersible binder, a binder soluble or dispersible in a mixture of water and an alcohol, and an infrared absorption material which is finely-dispersed in these binders, and exhibits strong absorbance in the wavelength range of 750 to 20000 nm, particularly 750 to 5000 nm. In addition, in order to disable transmission of chemical rays as needed, all compounds that absorb ultraviolet rays can be used.

The infrared absorbent material and all compounds that absorb ultraviolet rays include a dye and a pigment. Specific examples include phthalocyanine, substituted phthalocyanine derivatives, cyanine, merocyanine dyes, as well as polymethine dyes, carbon black, graphite, chromium oxide, iron oxide and the like as the pigment.

In Patent Document 2, the infrared ablation layer includes an IR absorbent metal layer.

Patent Document 1: Japanese Patent No. 3429634
Patent Document 2: Japanese Unexamined Patent Application Publication No. 2004-101751

DISCLOSURE OF THE INVENTION

Problems to be Solved by the Invention

However, in the infrared ray-sensitive material layer of the photosensitive original printing plate according to Patent Documents 1 and 2, carbon black, metal, an alloy and a metal compound are used, so that these materials transfer to a developing solution for developing the infrared ray-sensitive material layer to contaminate the developing solution, thereby raising a problem that the developing solution must be frequently exchanged.

Thus, as described above, it has been desired to solve the problem that a material included in the infrared ray-sensitive material layer transfers into a developing solution for developing the infrared ray-sensitive material layer to contaminate the developing solution.

The present invention has been made in view of circumstances in the abovementioned prior art. An object of the invention is to provide a photosensitive laminated original printing plate for letterpress printing and a process for producing a letterpress printing plate using the photosensitive laminated original printing plate, particularly, a photosensitive laminated original printing plate for fine letterpress printing, which does not contaminate a developing solution, can reduce the cost for exchanging the developing solution, and can eliminate vexatious complication, and a process for producing a letterpress printing plate using the photosensitive laminated original printing plate.

Means for Solving the Problems

In order to solve the aforementioned problems, the present inventors extensively investigated a mask material layer applied for the above-mentioned infrared ray-sensitive material layer. As a result, it was found that when the mask material layer includes a non-ultraviolet ray absorbent organic coloring matter and an ultraviolet ray absorbent organic coloring matter, and a binder soluble or dispersible in a mixture of water and an alcohol, and the non-ultraviolet ray absorbent material and the ultraviolet ray absorbent material are compatible with the binder, a uniform effluent without contamination such as developing sludges in the developing solution after development can be obtained, and no contamination such as developing sludges can be seen on a filter when the waste is discharged. Accordingly, the present invention was accomplished.

In an aspect of the invention, there is provided a photosensitive laminated original printing plate for letterpress printing including: a photosensitive resin layer which can be developed with water or a mixture of water and an alcohol and which has photosensitivity to ultraviolet rays on a support; a mask material layer which is removable with water or a mixture of water and an alcohol at least containing a non-ultraviolet ray absorbent organic coloring matter and an ultraviolet ray absorbent organic coloring matter, and a binder soluble or dispersible in water or a mixture of water and an alcohol, in which at least the photosensitive resin layer and the mask material layer are laminated sequentially, and the non-ultraviolet ray absorbent material and the ultraviolet ray absorbent material are compatible with the binder.

The non-ultraviolet ray absorbent organic coloring matter is preferably at least one selected from the group consisting of a nitroso compound, a metallic complex salt thereof, a polymethine dye, a squarylium dye, a thiol nickel complex salt, a phthalocyanine dye, a triarylmethane dye, an immonium dye, a diimmonium dye, a naphthoquinone dye, and an anthraquinone dye. In addition, it is preferable that the ultraviolet ray absorbent organic coloring matter is at least one selected from the group consisting of an azo dye, and a methine dye.

In addition, the process for producing a letterpress printing plate according to the present invention includes irradiating a pattern light with a chemical ray to a photosensitive resin layer for the original printing plate in which a photosensitive resin layer is at least formed on a support. Then, the printing plate for letterpress printing is obtained by developing with a developing solution consisting of water or a mixture of water and an alcohol to form a resin layer having a relief pattern on the support for printing. Such a process for producing a letterpress printing plate includes steps of: irradiating a non-ultraviolet ray on a mask material layer of a photosensitive laminated original printing plate for letterpress printing using the photosensitive laminated original printing plate for letterpress printing as an original plate for letterpress printing to allow the irradiated part of the mask material layer to sublimate by the irradiation, thereby changing into a mask image layer which corresponds to an ultraviolet transmissive region; irradiating an ultraviolet ray on the photosensitive resin layer with the mask image layer as a mask; and removing with a developing solution both the mask material layer remained without irradiation of the non-ultraviolet ray, and the ultraviolet ray unirradiated region of the photosensitive resin layer in the uncured state, unirradiated with the ultraviolet ray.

In the constitution, an infrared ray (infrared laser beam) and a partial visible light in part can be used as the non-ultraviolet ray. The visible light which may be used is not a visible light of the entire wavelength region, but a partial visible light of the wavelength region approximate to infrared region. Ar laser beams and YAG second harmonic laser beams are preferred.

EFFECTS OF THE INVENTION

According to the photosensitive laminated original printing plate for letterpress printing of the present invention, a mask image layer with high contrast can be formed, whereby a fine letterpress printing plate can be provided, and the developing solution can be prevented from contamination due to the absence of generation of developing sludge, leading to reduction of the cost for exchanging the developing solution, and to elimination of vexatious complication.

PREFERRED MODE FOR CARRYING OUT THE INVENTION

Preferred modes of the present invention will be explained in the following order.
[I] Photosensitive original plate for letterpress printing
(A) Mask material layer
(B) Photosensitive resin layer
(C) Support
(D) Cover sheet
[II] Process for Producing Letterpress Printing Plate
[I] Photosensitive Original Plate for Letterpress Printing As described above, the photosensitive laminated original printing plate for letterpress printing according to the present invention includes: a photosensitive resin layer which can be developed with water or a mixture of water and an alcohol, and which has photosensitivity to ultraviolet rays on a support; a mask material layer which is removable with water or a mixture of water and an alcohol at least containing a non-ultraviolet ray absorbent organic coloring matter and an ultraviolet ray absorbent organic coloring matter, and a binder soluble or dispersible in a mixture of water and an alcohol, in which at least the photosensitive resin layer and the mask material layer are laminated sequentially, and the non-ultraviolet ray absorbent material and the ultraviolet ray absorbent material are compatible with the binder. By such a constitution of the mask image layer, a fine letterpress printing plate can be provided, and the developing solution can be prevented from contamination due to the absence of generation of developing sludge, leading to reduction of the cost for exchanging the developing solution, and to elimination of vexatious complication.

In other words, when the non-ultraviolet ray is irradiated to the mask material layer, the non-ultraviolet ray absorbent material in the mask material layer absorbs the non-ultraviolet ray, whereby the mask material layer sublimates and disappears due to the absorbed energy. By sublimation of the mask material layer, ultraviolet transmissive region is formed in the shape of the mask image layer on mask material layer. By the ultraviolet ray that transmits through the ultraviolet transmissive region, the lower photosensitive resin layer is exposed to form a cross-linkage. On the other hand, the non-ultraviolet ray unirradiated part in the mask material layer remains without sublimating, and the ultraviolet ray absorbent organic coloring matter absorbs the ultraviolet ray at the time of the exposure of the photosensitive resin layer with the ultraviolet ray, so that the mask material layer serves as an ultraviolet ray untransmittive layer, and thus the cross-linkage formation by the UV-exposure on the lower photosensitive resin layer is prevented. Therefore, the non-ultraviolet ray unirradiated part in the mask material layer and the uncross-linked photosensitive resin layer below the part can be removed by development. Finally, the crosslinked photosensitive resin layer located below the non-ultraviolet irradiated part in mask material layer forms a relief part of the letterpress printing plate. The "sublimation" described herein is used synonymously with "fire blowing" and "ablation".

Since the mask material layer does not contain carbon black, metal, and alloy, transfer of these materials into a developing solution is avoided. Therefore, it does not cause contamination of the developing solution with the developing sludge generated by condensation of the carbon black, metal, and alloy. Thus, by using the photosensitive original plate for letterpress printing of the present invention, the developing solution is contaminated at development, so that the cost for exchanging the developing solution can be reduced, and the vexatious complication can be eliminated.

The components of the photosensitive original plate for letterpress printing of the present invention are explained in detail as follows.
(A) Mask Material Layer The mask material layer in the photosensitive original plate for letterpress printing of the present invention, includes a non-ultraviolet ray absorbent organic coloring matter and an ultraviolet ray absorbent organic coloring matter; and a binder soluble or dispersible in water or a mixture of water and an alcohol, which can be removed with water or a mixture of water and an alcohol, in which the non-ultraviolet ray absorbent material and the ultraviolet ray absorbent material are compatible with the binder.

The non-ultraviolet ray absorbent organic coloring matter can include absorbent organic coloring matters of visible or infrared rays. Among these, the infrared absorbent organic coloring matter with strong absorption in the range of 750 to 20000 nm is preferred. Any kind of materials can be used for the non-ultraviolet ray absorbent organic coloring matter as long as the mask material layer sublimates by the non-ultraviolet ray so that residuals do not remain. For example, the infrared absorbent organic coloring matter is preferred, which is preferably at least one selected from the group consisting of a nitroso compound, a metallic complex salt thereof, a polymethine dye (cyanine dye), a squarylium dye, a thiol nickel complex salt, a phthalocyanine dye, a triarylmethane dye, an immonium dye, a diimmonium dye, a naphthoquinone dye, and an anthraquinone dye. Among these, a dye without including a metal such as a phthalocyanine dye such as a poly(substituted) phthalocyanine compound, a cyanine dye, a squarylium dye, a chalcogenopyryloarylidene dye, a bis (chalcogenopyrylo)-polymethine dye, an oxyindolizine dye, a bis(aminoaryl)-polymethine dye, a merocyanine dye, a chroconium dye, and a quinoid dye is preferred. Specifically, a polymethine dye such as 2-[2-[2-chloro-5-methyl-3-[2-(1, 3-dihydro-1,3,3-trimethyl-2H-benzindole-2-indene)-ethylidene]-1-cyclohexene-1-yl]-ethenyl]-1,3,3-trimethyl-1H-benzindolium 4-methylbenzensulfonate or 8-[5-(6,7-dihydro-6-tert-butyl-2,4-diphenyl-5H-1-benzopyran-8-yl)-2,4-pentadienylidene]-5,6,7,8-tetrahydro-6-tert-butyl-2,4-diphenyl-1-benzopyryliumperchlorate; and a diimmonium dye such as N,N,N',N'-tetrakis(4-dibutylaminophenyl)-p-benzoquinone bis immonium perchlorate are included. Among these, in terms of strong absorption, a polymethine dye, a phthalocyanine dye, an immonium dye, and a diimmonium dye are preferred.

Any kind of materials can be used for the non-ultraviolet ray absorbent organic coloring matter as long as ultraviolet transmission that sensitizes the photosensitive resin layer is blocked, whereby the mask material layer sublimates by the non-ultraviolet ray so that residuals do not remain. Specific examples of the materials can include organic coloring matters that absorb an ultraviolet light or a visible light. Such an UV absorber can include, for example, azo dyes such as a benzene azo dye, a naphthalene azo dye, and a heterocycle azo dye; and methine dyes such as a polymethine dye and an azomethine dye. Among these, azo dyes are preferred.

The binder is not particularly limited as long as it has film-forming properties, and it is substantially transparent to ultraviolet rays; however, preferably, the binder is non-compatible or substantially non-compatible with the photosensitive resin layer. The binder which can be dissolved in water or a mixture of water and an alcohol is preferred, specifically, a resin having a hydroxyl group or a carboxyl group is preferable. For example, polyvinylbutyral, polyvinylacetal, an epoxy resin, a cellulose derivative, a polyalkylene oxide derivative, a polyurethane derivative can be included.

Specific examples of the cellulose derivative include methyl cellulose, hydroxy cellulose, and hydroxypropyl cellulose.

The polyalkylene oxide derivative includes compounds represented by the following general formulas (1) to (8).

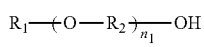
(1)

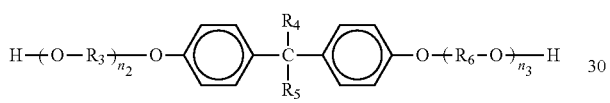
(2)

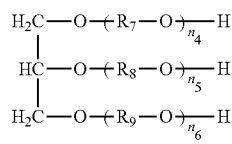
(3)

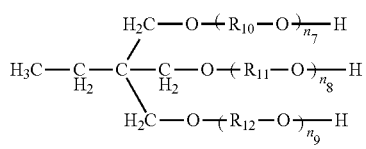
(4)

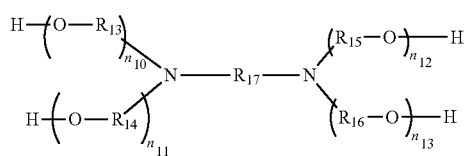
(5)

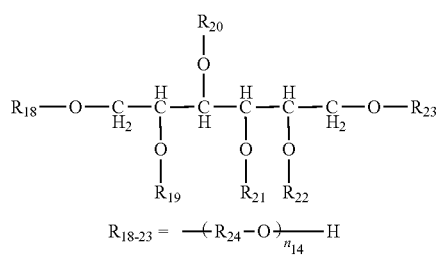
(6)

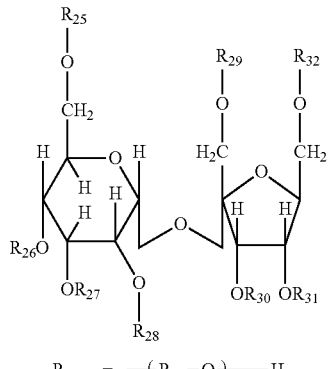
(7)

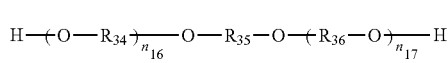
(8)

In addition, the polyurethane derivative includes, for example, compounds represented by the following general formula (9).

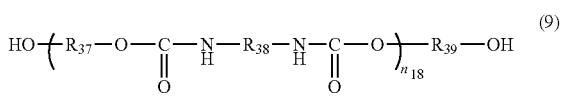
(9)

In the general formulas (1) to (9), $R_1$, $R_4$, and $R_5$ are a hydrogen atom or an alkyl group; $R_{17}$ and $R_{35}$ are $C_mH_{2m}$, wherein m is an integer of 1 or more, and H may be substituted; $R_2$, $R_3$, $R_6$ to $R_{16}$, $R_{24}$, $R_{33}$, $R_{34}$, $R_{36}$, $R_{37}$, $R_{38}$ and $R_{39}$ are $C_pH_{2p}$ (wherein p is an integer of 3 or more, and H may be substituted); and $n_1$ to $n_{18}$ are an integer of 1 or more.

When the binder of the mask material layer in the present invention is constituted by using the various kinds of binder materials, each binder material may be used alone, or in combination of multiple kinds thereof.

The content of the non-ultraviolet ray absorbent organic coloring matter in the mask material layer is preferably 5 to 50% by mass based on the total solid content. The content of the non-ultraviolet ray absorbent organic coloring matter being 5% by mass or more is preferable since sublimability required on non-ultraviolet irradiation is achieved. In addition, the content of the non-ultraviolet ray absorbent organic coloring matter is preferably 50% by mass or less, since the non-ultraviolet ray absorbent material has sufficient compatibility with the binder.

The content of the ultraviolet ray absorbent material is preferably 5 to 50% by mass based on the total solid content. The content of the ultraviolet ray absorbent organic coloring matter is preferably 5% by mass or more since ultraviolet ray absorptivity required as mask material layer on ultraviolet irradiation is achieved. In addition, the content of the ultraviolet ray absorbent organic coloring matter is preferably 50% by mass or less, since the ultraviolet ray absorbent material has sufficient compatibility with the binder.

The content of the binder in the mask material layer is preferably 10 to 90% by mass based on the total solid content. The content of the binder is preferably 10% by mass or more since a superior mask material layer can be formed since the mask material layer has necessary film-forming properties. The content of the binder is preferably 90% by mass or less since sufficient sublimability and ultraviolet ray absorptivity as the mask material layer can be achieved.

In the preparation of the resin composition for forming the mask material layer, it is preferred that the components for forming the layer may be dissolved in an organic solvent, and the solution may be applied to the photosensitive resin layer, followed by evaporation of the organic solvent to give a mask material layer. Examples of the organic solvent may include ethers such as dibutyl ether, isopropyl ether, dioxane and tetrahydrofuran, ketones such as acetone, diethyl ketone, methyl ethyl ketone, methyl isobutyl ketone, methyl propyl ketone and cyclohexanone, esters such as ethyl acetate, n-propyl acetate and n-butyl acetate, and aromatic hydrocarbons such as benzene, toluene and xylene, and the like. These organic solvents may be used alone or as a mixture. The thickness of the mask material layer is preferably 3 to 20 μm and more preferably 3 to 10 μm.

(B) Photosensitive Resin Layer

The photosensitive resin layer in the photosensitive laminated original printing plate for letterpress printing according to the present invention is a layer which can be developed with water or a mixture of water and an alcohol, and which has photosensitivity to ultraviolet rays. The photosensitive resin layer may be formed with a photosensitive resin composition containing an elastomeric binder, one or more sorts of monomers and an initiator responding to ultraviolet rays. All of the photosensitive resin compositions suitable for the letterpress printing, in general, may be used. Among such elastomeric binders, the binder having water-solubility or being soluble in water or a mixture of water and an alcohol is preferred. As the elastomeric binder, for example, partially saponificated polyvinyl acetate resins and derivatives thereof, copolymers of an acrylic ester and maleic acid, alkyd resins, polyoxyethylene, Water- or alcohol-soluble polyamide resins, ethylene-vinyl acetate copolymers, polystyrene resins, phenolic resins, polyester resins, epoxy resins, and polyvinyl butyral resin as described in Japanese Unexamined Patent Publication No. Hei 4-240644, Japanese Patent No. Sho 53-2082, Japanese Unexamined Patent Publication No. Sho 61-17148, Japanese Unexamined Patent Publication No. Sho 62-187848, Japanese Unexamined Patent Publication No. Sho 63-8735, Japanese Unexamined Patent Publication No. Sho 63-10150, Japanese Unexamined Patent Publication No. Hei 1-274132, Japanese Unexamined Patent Publication No. Hei 1-287671, Japanese Unexamined Patent Publication No. Hei 2-39048, Japanese Unexamined Patent Publication No. Hei 2-73810, and Japanese Unexamined Patent Publication No. Hei 4-240855 can be used. Particularly, copolymers of a partially or fully saponificated vinyl alcohol with (meth)acrylic acid, (meth)acrylamide, N-methylol(meth)acrylamide, styrene, propylene, maleic anhydride, (meth)acrylonitrile, or (meth)acrylic ester as monomers; ether compounds formed by reacting this copolymer with a lower alkylol(meth)acrylamide such as methylol(meth)acrylamide and ethylol(meth)acrylamide; diamines such as N,N'-bis(aminomethyl)-piperazine, N,N'-bis (β-aminoethyl)-piperazine; dicarboxylic acids such as N,N'-bis(carboxymethyl)-piperazine, N,N'-bis(carboxymethyl)-methylpiperazine; water-soluble polyamides obtained by polymerization of those lower alkyl esters or acid halides, ω-amino acids such as N-(aminoethyl)-N'-(carboxymethyl)-piperazine as monomers; and polyamide resins having a sulfonate group and a basic component are preferably used.

For one or more kinds of monomers included in the photosensitive resin layer, (meth)acryl acid, (meth)acrylic ester, (meth)acrylamide, (meth)acrylonitrile, styleneglycidyl (meth)acrylate, allyl(meth)acrylate, trimethylolpropane tri (meth)acrylate, allyl compounds, vinyl ether compounds, and vinyl ester compounds and the like having at least one photopolymerizable alkenyl group can be used. Preferably, condensates of urea, thiourea, or a lower alkylated, lower alkylolated, or lower alkyl lower alkylolated derivative thereof with lower alkylrol(meth)acrylamide; diester compounds formed by diesterifying a hydroxyl group of polyethylene glycol with (meth)acrylic acid can be used.

The photosensitive resin layer contains the monomer at 5 to 30 parts by weight, and preferably 10 to 20 parts by weight based on 100 parts by weight of the binder in the photosensitive resin layer. The monomer content less than the 5 parts by mass is not preferable for letter printing because abrasion resistance and chemical resistance of a coating film after being cured with exposure of ultraviolet rays may be reduced. The monomer content more than 30 parts by mass also is not preferable for letter printing because the elastomeric property of the photosensitive resin layer may be reduced.

The initiator includes aromatic ketones such as benzophenone, benzoin ethers such as benzoin methyl ether, benzoin ethyl ether, benzoin isopropyl ether, α-methylolbenzoin methyl ether, α-methoxybenzoin methyl ether and 2,2-diethoxyphenylacetophenone, methoxyphenylacetophenone (2,2-1,2-dimethoxy-diphenylethane-1-one), and 2-benzyl-2-dimethylamino-1-(4-morpholinophenyl)-butanone-1; substituted or unsubstituted polynuclear quinones; as well as initiators disclosed in the specifications of U.S. Pat. Nos. 4,460,675 and 4,894,315. The initiators may be used alone or in combination.

It is preferable to include the initiator in the range of 0.001 to 10% by mass based on a total weight of the photosensitive resin layer.

Furthermore, additives such as a sensitizer, a heat polymerization inhibitor, a plasticizer and a colorant may be used in the photosensitive resin composition which forms the photosensitive resin layer, depending on a required property. Various methods can be used for preparing the photosensitive resin composition, for example, mixing a raw material to be combined after dissolving in a suitable solvent such as chloroform, tetrachloroethylene, methyl ethyl ketone, or toluene, and casting the solvent into a frame mold to allow for evaporation to obtain a plate. In addition, the raw material may be kneaded in a kneader or a roll mill without using the solvent, and a plate having a desired thickness can be molded with an extruder, an injection molding machine, a press, or the like. The thickness of the photosensitive resin layer is preferably 0.3 to 3 mm, and more preferably 0.43 to 2.84 mm.

(C) Support

A support in the photosensitive original printing plate for letterpress printing of the present invention may be any of supports which meet physical performances such as mechanical strength required for a printing condition in letterpress printing, and examples thereof may be any of supports known for typical letterpress printing plates, such as metals, plastic films, papers and complexes thereof. These include polymer films comprised of an addition polymerization polymer or a linear condensed polymer, transparent foams, woven fabric, nonwoven fabric, such as glass fiber fabric, and metals such as steel, iron, aluminum, zinc, copper, brass, and stainless. The support is preferably transparent to non-infrared ray so that back exposure is facilitated. The more preferred support includes a molded object of polyethylene terephthalate (PET), nylon, polyethylene, polypropylene, an acrylic resin or polyester in the shape of a plate or a film. In an adhesiveness accelerating layer for letterpress printing original plate, a polyester resin, a polyurethane resin, an epoxy resin, an acrylic ester resin, an ethylene-vinyl acetate resin; or a polyvinyl alcohol resin, a cellulosic resin as described in Japanese Unexamined Patent Publication No. 61-17148 is preferably used as a main component.

(D) Cover Sheet

To protect the mask material layer in the photosensitive original plate for letterpress printing of the present invention, a cover sheet can be provided on the upper layer. In addition, a cap layer may be provided on the surface of the mask material layer, and the cover sheet may be provided on this cap layer.

The cover sheet may be any of cover sheets known for typical letterpress printing plates, such as metals, plastic films, papers and complexes thereof. These include polymer films comprised of an addition polymerization polymer or a linear condensed polymer, transparent foams, woven fabric, nonwoven fabric, such as glass fiber fabric, and metals such as steel, aluminum, zinc, copper, brass, and stainless. Polyamides, polyesters, polyolefin, polyvinyl chlorides are used for films. A film of polyethylene terephthalate (PET) nylon, polyethylene, polypropylene, an acrylic resin or polyester, or a laminated films thereof is used. The cover sheet is preferably a film, the thickness of which is preferably 10 to 500 μm, and more preferably 20 to 200 μm.

The cover sheet may be coated with a peeling layer so that the peeling layer is placed between this cover sheet and the mask material layer. By providing peeling layer, the cover sheet is more easily peeled before exposing the mask material layer to a pattern light, whereby the surface roughness of the mask material layer by peeling can be prevented.

[II] Process for Producing Letterpress Printing Plate

Specific examples of the process for producing the photosensitive laminated original printing plate for letterpress printing of the present invention is descried below. First, a photosensitive resin composition prepared by mixing an elastomeric binder, a monomer, a polymerization initiator and other ingredients is formed into a hot melt, and this is calendared so as to have a desired thickness. Alternatively, using an extruder, the photosensitive resin composition is melted, mixed, degassed and filtrated, and subsequently extruded between a support and a transient cover sheet, which is calendared to have a desired thickness. Alternatively, the photosensitive resin layer is formed on the support layer by a method in which the support and the cover sheet are placed in a die and the photosensitive resin composition is extruded between the both. Next, a resin composition (masking material) containing a binder having film-forming properties, a non-ultraviolet ray absorbent organic coloring matter, and an ultraviolet ray absorbent organic coloring matter is directly applied on the photosensitive resin layer to obtain a mask material layer. Alternatively, the resin composition (masking material) is applied on a cover sheet to obtain the mask material layer. Then, the temporary cover sheet on the mask material layer is removed or not, and the mask material layer is laminated with the photosensitive resin layer formed on the support layer by using heat and/or pressure to obtain the photosensitive laminated original printing plate for letterpress printing. In the production, the desired printing plate can be also produced by sequentially laminating the mask material layer, the photosensitive resin layer, and the support layer on the cover sheet.

In the letterpress printing plate using the photosensitive laminated original printing plate for letterpress printing provided in the aforementioned production process, the mask material layer is changed into the mask image layer on which the irradiation part sublimates, and disappears by irradiating a non-ultraviolet ray such as infrared laser beams or the above-mentioned partial visible light on the mask material layer according to an image pattern for printing. Then, an ultraviolet chemical ray is irradiated on the photosensitive resin layer with the mask image layer as a mask, and an ultraviolet chemical ray unirradiated region of the mask material layer remaining without the non-ultraviolet ray being irradiated, and the photosensitive resin layer in uncured state without the ultraviolet chemical ray being irradiated are removed by a developing solution. Thus, a printing plate image is formed to produce the photosensitive laminated original printing plate for letterpress printing.

Infrared laser beams among the non-ultraviolet rays which may be used preferably have the wavelength of 700 to 20000 nm. For example, various lasers such as an argon ion, a krypton ion, helium-neon, helium-cadmium, a ruby, a glass, a titanium sapphire, a dye, nitrogen, metal vapor, a semiconductor, and a YAG are used, which should be selected to meet a requirement. Among these, a semiconductor laser of 750 to 880 nm and a Nd-YAG laser of 1060 nm are preferred. For these infrared lasers, the generating unit and a drive system unit are controlled by a computer, and digitized image information is directly recorded on the photosensitive laminated original printing plate for letterpress printing.

In addition, a light in the visible light region of the non-ultraviolet ray to be used preferably has a wavelength peak in 450 to 700 nm, Ar laser beams having a wavelength peak in around 488 nm and YAG second harmonic laser beams having a wavelength peak in around 532 nm are preferred, as described above.

Preferable ultraviolet rays for irradiation on the photosensitive resin layer in the present invention mean the infrared rays; the Ar laser beams and electromagnetic waves having the shorter wavelength than that of the light of the visible region around the YAG second harmonic laser beams; and preferably visible rays having the wavelength range shorter than 488 nm of the Ar laser beam and electromagnetic wave with the ultraviolet range; preferably electromagnetic waves having the wavelength peak in 300 to 450 nm; and further preferably electromagnetic waves having a wavelength peak in 350 to 400 nm. Light sources for such ultraviolet rays include a high-pressure mercury-vapor lamp, an ultraviolet fluorescent lamp, a carbon-arc lamp, and a xenon lamp.

The developing solution used in the development treatment may be any of an organic solution, water, and an aqueous or semi-aqueous solution as long as it has a property of dissolving, swelling, or dispersing the photosensitive resin layer, and the developing solution is selected depending on the chemical properties of the resin to be removed. Examples of appropriate organic solvent developing solutions include aromatic or aliphatic hydrocarbon solvents, aliphatic or aromatic halohydrocarbon solvents, or mixtures thereof and an appropriate alcohol. The semi-aqueous developing solution contains water or an organic solvent miscible with water, and an alkaline material. Examples of the aqueous developing solutions include aqueous solutions obtained by dissolving in water, for example, an ester such as heptyl acetate or 3-methoxybutyl acetate; a hydrocarbon such as a petroleum fraction, toluene or decalin; a chlorine solvent such as tetrachloroethylene; an amine such as monoethanolamine, diethanolamine or triethanolamine; sodium hydroxide, potassium hydroxide, sodium carbonate, or ammonia. Alternatively, a mixture of the above solvent and an alcohol such as propanol, butanol or pentanol can be also used. In washing, an arbitrary method such as dipping, spraying from a nozzle or brushing using a brush can be employed.

On producing the letterpress printing plate, productivity of the printing plate material improves remarkably by attaching the photosensitive laminated original plate for letterpress printing to a drum in the shape of a cylinder, sequentially irradiating the non-ultraviolet ray and the ultraviolet ray, and conducting a development treatment.

EXAMPLES

The present invention will be illustrated in more detail with reference to the following Examples, but the following Examples are only exemplifications for suitably illustrating the invention, and do not any how limit the invention. Optical densities shown in the following Examples were measured using a spectrophotometer (product name: U-2000 produced by Hitachi, Ltd).

Example 1

Polyvinyl alcohol (hereinafter referred to as "PVA") used as a binder (product name: PVA405, produced by KURARAY CO., LTD) was dissolved in pure water/isopropyl alcohol (hereinafter referred to as "IPA") (2:1) to obtain 10% by mass of an uniform binder solution. To 50 g of this binder solution, was added 1.0 g of phthalocyanine-based infrared absorbent dye (product name: S0306, produced by Nihon Siber Hegner K.K.), and then stirred to be uniformly dissolved. To this mixture, was added 1.5 g of an ultraviolet absorbent azo dye (product name: Sumilight Supra Yellow, produced by Sumitomo Chemical Co., Ltd.) to prepare a uniform mask material solution.

Next, the mask material solution was applied on a PET film (cover sheet (D)) with a thickness of 100 µm to bring the thickness of the applied film after drying to 5 µm, dried at 100° C. for five minutes, whereby a mask material layer (C) was formed. Optical density at 370 nm (ultraviolet ray) of this mask material layer (C) was measured by using a spectrophotometer (product name: U-2000 produced by Hitachi, Ltd), which was 2.5, and thus it was confirmed that the ultraviolet transmission was blocked.

On the other hand, a solution in which 100 parts by mass of partially saponificated PVA with a saponification degree of 73% by mole and an average polymerization degree of 500, 100 parts by mass of photosensitive reaction product as described below, 10 parts by mass of ethyleneglycol, 100 parts by mass of benzoin isopropyl ether, and 0.05 parts by mass of methyl hydroquinone are dissolved in 10 parts by mass of water with heat was casted on a polyester film provided with an antihalation layer in advance, and then dried at 40° C. for 15 hours, whereby a photosensitive resin layer with a thickness of 0.9 mm was formed. The photosensitive product was obtained as follows: 0.25 parts by mass of methyl hydroquinone was dissolved in 10 parts by mass of water; 74 parts by mass of dimethylol ether, 202 parts by mass of N-methylolacrylamide, and 2 parts by mass of ammonium chloride were added thereto; the mixture was heated to 80° C., and then stirred for two hours. Subsequently, this reaction product was added by pouring into 1000 parts by mass of acetone, and the precipitate was filtered off to be removed, whereby the photosensitive product, which was a polymer condensate, was obtained.

On the photosensitive resin layer surface was slightly applied a combined solvent of water/methanol (mass ratio: 1:2), and then the cover sheet (D) on which the layer (C) created earlier was formed was compressed so that it was laminated in contact with the photosensitive surface (C), whereby the photosensitive laminated original plate for letterpress printing of the present invention was produced.

When the cover sheet (D) was peeled away from the resulting photosensitive laminated original plate for provided letterpress printing. The layer (C) was adhered on the photosensitive layer surface. On the exposed (C) layer, were irradiated semiconductor infrared laser beams (non-ultraviolet ray) with a wavelength of 830 nm and an output of 600 mW according to a pattern so that a mask pattern has a resolution of 100 line/mm and an irradiation energy of 3 J/cm$^2$, to allow the layer (C) to sublimate selectively.

This mask material layer (C) becomes the mask image layer (C') with a pattern latent image by the ultraviolet transmission/non-transmission by receiving the pattern irradiation of the infrared laser as described above. Optical density at 370 nm (ultraviolet ray) of the infrared laser beams irradiated region of this mask image layer (C'), i.e., sublimated part of the layer (C) was measured by using a spectrophotometer (product name: U-2000 produced by Hitachi, Ltd), which was 0.2, and thus it was confirmed that the ultraviolet ray was transmitted.

Next, by using ultraviolet ray having a center wavelength at 370 nm, main exposure was performed at 1440 mJ/cm$^2$ from the mask image layer (C') side through the mask image layer (C'). By the ultraviolet ray main exposure, ultraviolet pattern light in accordance with the latent image pattern of the mask image layer (C') was irradiated on the photosensitive resin layer (B), whereby a crosslinking reaction was caused to permit curing in the region where the ultraviolet ray was irradiated. Then, to remove the mask image layer (C') and the uncrosslinked region of the photosensitive resin layer (B), development treatment was performed at a liquid temperature of 35° C. for two minutes using an aromatic hydrocarbon based developing solution (product name FD0-S2 produced by Tokyo Ohka Kogyo Co., Ltd.) as a developing solution. As a result, the photosensitive resin cured according to an objective image, and thereby a relief image comprising the cured resin was formed on the supporting plate layer (A).

No readhesion of residues of the development and the like was observed on the resulting plate face. After the development treatment, the supporting plate layer was dried at 55° C. for 50 minutes, and then postexposure was performed at 1500 mJ/cm$^2$ by an ultraviolet ray having a center wavelength at 370 nm to obtain the letterpress printing plate of the present invention.

The letterpress printing plate obtained in this way was observed, which exhibited a sharp image at the edge part, and superior image reproducibility. A printing test was performed by using this letterpress printing plate, and consequently a superior printed matter was obtained. The printing medium used at this time was a coated paper. In addition, when this letterpress printing plate was developed so that a total developing area became 100 m$^2$, no developing sludges occurred in the developing solution, with the developing solution being uniform, and further no sludges remained on a filter on discharge of the waste.

Comparative Example 1

PVA used as a binder (product name: PVA405, produced by KURARAY CO., LTD) was dissolved in pure water/isopropyl alcohol (hereinafter referred to as "IPA") (2:1) to obtain 10% by mass of a uniform binder solution. To 50 g of this binder solution, was added 1.0 g of carbon black (product name, Himicron K black #7360 produced by Mikuni Color), and then stirred to be uniformly dissolved.

Next, the mask material solution was applied on a PET film (cover sheet (D)) with a thickness of 100 µm to bring the thickness of the applied film after drying to 3 µm, dried at 100° C. for five minutes, whereby the mask material layer (C) was formed. Optical density at 370 nm (ultraviolet ray) of this mask material layer (C) was measured by using a spectrophotometer (product name: U-2000 produced by Hitachi, Ltd), which was 2.5, and thus it was confirmed that the ultraviolet transmission was blocked.

The photosensitive surface (C) was compressed so that it was laminated in contact with the photosensitive surface, whereby the photosensitive laminated original plate for letterpress printing of the present invention was produced in the similar way to Example 1.

A plate was made by using this photosensitive laminated original plate for letterpress printing in the similar way to Example 1, and then the letterpress printing plate obtained in this way was observed, which exhibited a sharp image at the edge part, and superior image reproducibility. A printing test was performed by using this letterpress printing plate, and consequently a superior printed matter was obtained. In addition, when this letterpress printing plate was developed so that a total developing area became 100 $m^2$, developing sludges occurred in the developing solution, without the developing solution being uniform, and further carbon black coagulated sludges remained on a filter on discharge of the waste.

Comparative Example 2

PVA used as a binder (product name: PVA405, produced by KURARAY CO., LTD) was dissolved in pure water/isopropyl alcohol (hereinafter referred to as "IPA") (2:1) to obtain 10% by mass of a uniform binder solution.

Next, the binder solution was applied on a PET film (cover sheet (D)) with a thickness of 100 μm to bring the thickness of the applied film after drying to 3 μm, dried at 100° C. for five minutes. Then vapor-deposition of aluminum was conducted to bring a thickness of 1 μm on this coating face by a vacuum evaporation method, whereby the mask material layer (C) was formed. Optical density at 370 nm (ultraviolet ray) of this mask material layer (C) was measured by using a spectrophotometer (product name: U-2000 produced by Hitachi, Ltd), which was 2.5, and thus it was confirmed that the ultraviolet transmission was iblocked.

The photosensitive surface (C) was compressed so that it was laminated in contact with, whereby the photosensitive laminated original plate for letterpress printing of the present invention was produced in the similar way to Example 1.

A plate was made by using this photosensitive laminated original plate for letterpress printing in the similar way to Example 1, and then the letterpress printing plate obtained in this way was observed, which exhibited a sharp image at the edge part, and superior image reproducibility. A printing test was performed by using this letterpress printing plate, and consequently a superior printed matter was obtained. In addition, when this letterpress printing plate was developed so that a total developing area became 100 $m^2$, developing sludges occurred in the developing solution, without the developing solution being uniform, and further aluminum coagulated sludges remained on a filter on discharge of the waste.

INDUSTRIAL APPLICABILITY

As discussed above, the photosensitive laminated original plate for letterpress printing of the present invention is formed by laminating at least a photosensitive resin layer having photosensitivity to ultraviolet rays on support and a mask material layer at least containing a non-ultraviolet ray absorbent material and an ultraviolet ray absorbent material, in which the non-ultraviolet ray absorbent material is a non-ultraviolet ray absorbent organic coloring matter, the ultraviolet ray absorbent material is an ultraviolet ray absorbent organic coloring matter, and the photosensitive laminate is used as an original printing plate for letterpress printing.

According to the invention having the abovementioned characteristics and constitution, a letterpress original printing plate where a mask image layer may be formed without damaging the surface of the photosensitive resin layer which is an underlayer thereof and with excellent contrast, and a process for producing a letterpress printing plate using the letterpress original printing plate can be provided. In particular, contamination of a developing solution can be avoided, thereby leading to reduction of the cost for exchanging the developing solution, and thus vexatious complication is eliminated.

The invention claimed is:

1. In a process for producing letterpress printing plate comprising irradiating a pattern light with a chemical ray to a photosensitive resin layer for the original printing plate in which a photosensitive resin layer is at least formed on a support, and then obtaining the printing plate for letterpress printing by developing with a developing solution consisting of water to form a resin layer having a relief pattern on the support for printing,
the process comprising steps of:
irradiating a non-ultraviolet ray on a mask material layer of a photosensitive laminated original printing plate for letterpress printing to allow the irradiated part of the mask material layer to sublimate by the irradiation, thereby changing into a mask image layer which corresponds to an ultraviolet transmissive region;
irradiating an ultraviolet ray on the photosensitive resin layer with the mask image layer as a mask; and
removing with a developing solution both the mask material layer remaining without irradiation of the non-ultraviolet ray and the ultraviolet ray unirradiated region of the photosensitive resin layer in the uncured state,
wherein the photosensitive laminated original printing plate for letterpress printing comprises:
a photosensitive resin layer which can be developed with water and which has photosensitivity to ultraviolet rays on a support;
a mask material layer which is removable with water consisting essentially of a non-ultraviolet ray absorbent organic coloring matter and an ultraviolet ray absorbent organic coloring matter; and a binder soluble or dispersible in water, wherein
the photosensitive resin layer is formed on the support and the mask material layer is at least laminated thereon, and the non-ultraviolet ray absorbent organic coloring matter and the ultraviolet ray absorbent organic coloring matter are compatible with the binder,
the content of the non-ultraviolet ray absorbent organic coloring matter in the mask material layer is 5 to 50% by mass based on the total solid content, the content of the ultraviolet ray absorbent organic coloring matter in the mask material layer is 5 to 50% by mass based on the total solid content, and the content of the binder in the mask material layer is 10 to 90% by mass based on the total solid content,
wherein the non-ultraviolet ray absorbent organic coloring matter in the mask material layer absorbs the non-ultraviolet ray, whereby the mask material layer sublimates and disappears due to the absorbed energy, and wherein
the developing solution can be prevented from contamination due to the absence of generation of developing sludge.

2. A photosensitive laminated original printing plate for letterpress printing according to claim 1, wherein the non-ultraviolet ray absorbent organic coloring matter is at least one selected from the group consisting of a nitroso compound, a metallic complex salt thereof, a polymethine dye, a squarylium dye, a thiol nickel complex salt, a phthalocyanine dye, a triarylmethane dye, an immonium dye, a diimmonium dye, a naphthoquinone dye, and an anthraquinone dye.

3. A photosensitive laminated original printing plate for letterpress printing according to claim 1, wherein the ultraviolet ray absorbent organic coloring matter is at least one selected from the group consisting of an azo dye and a methine dye.

* * * * *